(12) United States Patent
Narawade et al.

(10) Patent No.: US 11,296,683 B2
(45) Date of Patent: Apr. 5, 2022

(54) LOW-SWING SCHMITT TRIGGERS

(71) Applicant: SiFive, Inc., San Mateo, CA (US)

(72) Inventors: Santosh Mahadeo Narawade, Bangalore (IN); Jithin K, Bangalore (IN); Mohit Gupta, San Jose, CA (US)

(73) Assignee: SiFive, Inc., San Mateo, CA (US)

( * ) Notice: Subject to any disclaimer, the term of this patent is extended or adjusted under 35 U.S.C. 154(b) by 0 days.

(21) Appl. No.: 16/827,989

(22) Filed: Mar. 24, 2020

(65) Prior Publication Data

US 2021/0305972 A1    Sep. 30, 2021

(51) Int. Cl.
*H03K 3/3565* (2006.01)
*H03K 3/356* (2006.01)

(52) U.S. Cl.
CPC ..... *H03K 3/3565* (2013.01); *H03K 3/356104* (2013.01)

(58) Field of Classification Search
CPC .......... H03K 3/3565; H03K 3/356104; H03K 3/356113; H03K 3/356121; H03K 3/35613; H03K 3/356139; H03K 3/356147; H03K 3/356156; H03K 3/356165; H03K 3/356173; H03K 3/356182; H03K 3/356191
See application file for complete search history.

(56) References Cited

U.S. PATENT DOCUMENTS

| | | | |
|---|---|---|---|
| 4,539,489 A | 9/1985 | Vaughn | |
| 4,563,594 A * | 1/1986 | Koyama | H03K 3/3565 327/206 |
| 5,489,866 A * | 2/1996 | Diba | H03K 3/012 327/205 |
| 5,874,844 A | 2/1999 | Shin | |
| 6,353,346 B1 * | 3/2002 | Chan | H03K 3/3565 327/112 |
| 6,441,663 B1 * | 8/2002 | Chuang | H03K 3/3565 327/206 |
| 6,690,222 B2 * | 2/2004 | Nair | H03K 3/012 327/205 |
| 8,736,333 B1 * | 5/2014 | Tercariol | H03K 3/3565 327/205 |
| 2014/0266848 A1 * | 9/2014 | Henzler | G04F 10/005 341/166 |

OTHER PUBLICATIONS

Wikipedia; "Schmitt trigger" Retrieved on Feb. 8, 2020 from "https://en.wikipedia.org/w/index.php?title=Schmitt_trigger&oldid=939764069".

* cited by examiner

*Primary Examiner* — Patrick C Chen
(74) *Attorney, Agent, or Firm* — Young Basile Hanlon & MacFarlane

(57) ABSTRACT

Systems and methods are disclosed for low-swing Schmitt triggers. For example, an apparatus includes a Schmitt trigger including an input node, an output node, and a feedback node that is configured to bear a feedback voltage level that is a sum of an input voltage level at the input node and an attenuated voltage level of the output node; a current source connected to the output node; a voltage sensor connected to the feedback node and configured to cause the current source to pull up an output voltage level at the output node responsive to the feedback voltage level crossing a threshold.

9 Claims, 5 Drawing Sheets

LOW-SWING SCHMITT TRIGGERS

TECHNICAL FIELD

This disclosure relates to low-swing Schmitt triggers.

BACKGROUND

A Schmitt trigger (e.g., a CMOS Schmitt Trigger) may be used to convert an irregular or sine or triangular wave into a square wave or pulse to address a noise problem, hence it is widely used in both Analog and Digital domain circuits. Schmitt Triggers are widely used as signal recreation circuits in order to filter out noise and output a square wave. Normally a Schmitt trigger has two transition threshold voltages, when the input crosses either threshold voltage, depending on the state transition, it will be either logic one or logic 0, while comparators have only one threshold voltage. This characteristic of the Schmitt trigger is called hysteresis. The hysteresis of Schmitt Trigger is used to gain better noise margin and stable operation than that of a comparator.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Overview

Figure 1:
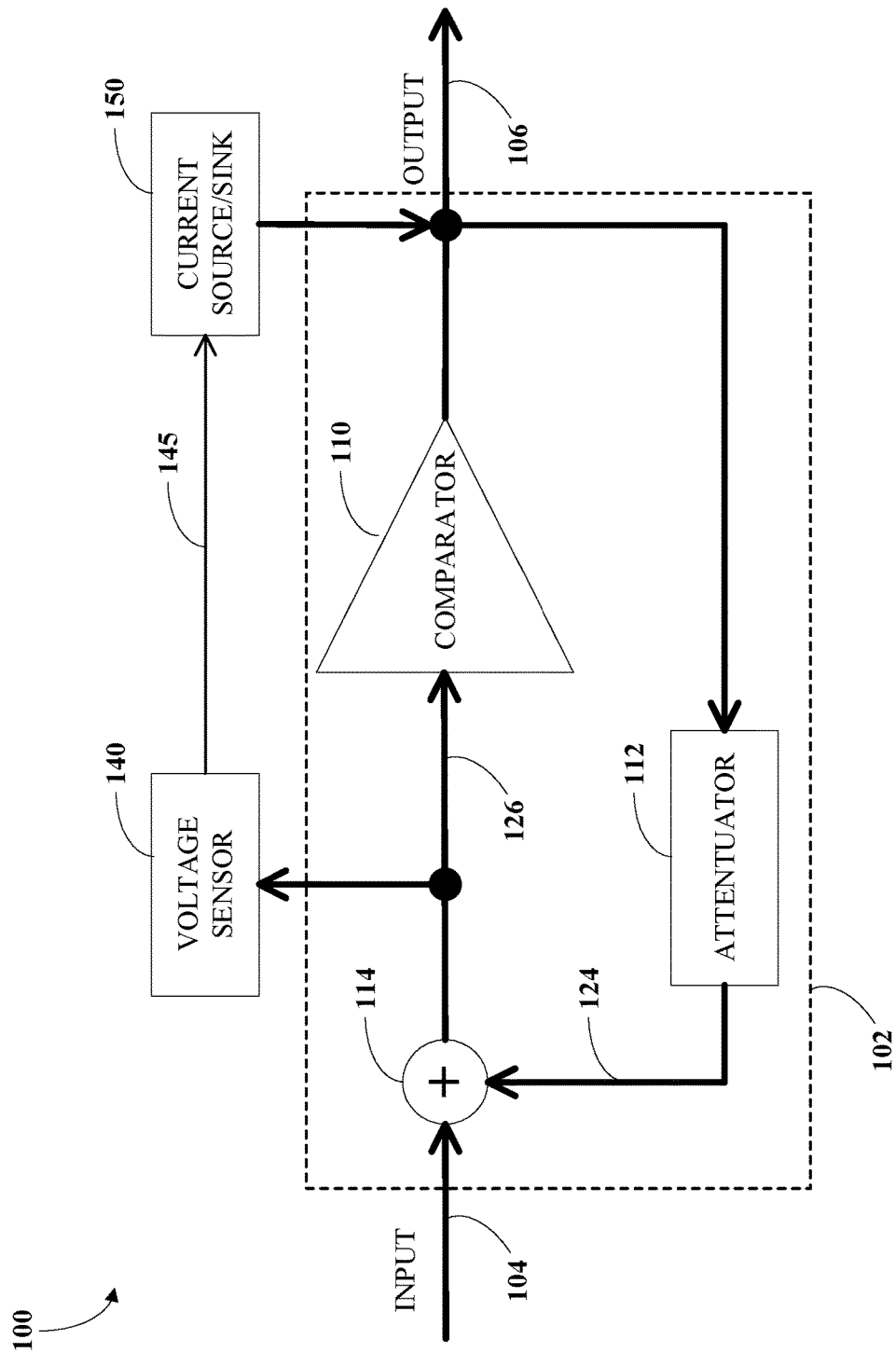
FIG. 1 is a block diagram of an example of a low-swing Schmitt trigger.

A Schmitt trigger circuit used widely for its hysteresis generation in an input buffer characteristic. The hysteresis range may directly impact noise margin in the circuit behavior, but if the inputs are exactly nearing a lower threshold (V_l) and an upper threshold (V_h), there could be a significant propagation delay due to shorter overdrive available to circuit during a state transition. Once a threshold voltage is crossed, it may be helpful to boost transconductance of circuit in order to achieve higher speed and lower delays. When a Schmitt trigger circuit is employed in a logic circuit, the circuit may be expected to operate at a faster switching speed irrespective of the voltage margins beyond the thresholds. That is, once the input voltage crosses the threshold level just by 100 mV beyond, the speed should be faster. Conventional architectures fail to address this issue and may experience large delays if the input voltage is just beyond the thresholds and thus existing architectures may not be suitable for achieving higher speeds due to an inbuild failure to sense the inputs with low swing beyond a threshold. A minimal swing at the input of a Schmitt trigger, may prevent the output from switching the state immediately, thereby causing false evaluation for the particular inputs which are beyond the thresholds, but with lesser margins. For example, this may be true in the case of circuits having signal integrity issues and long channel die-to-die serdes where degradation at input peak2peak is less, but still beyond noise margin. There is a need to have an architecture to implement higher speed state transitions once the threshold voltages are crossed, even in the case of a low-swing input voltage signal. Described herein are architectures that address this issue of higher delay for the inputs near the noise margin levels (+V_h, -V_l).

For example, some implementations sense an input change once it crosses the threshold voltages set by a traditional Schmitt trigger circuit and provide an additional parallel path for helping the Schmitt trigger to source/sink more current in order to achieve lesser delay in state change and achieve higher speed. This may enable a state transition even though the input swing remains low and have just barely crossed the threshold. In some implementations, an architecture may be verified using across process-voltage-temp corners and may achieve remarkable delta in delay decrease and may enable switching a rates 10× faster than a traditional Schmitt trigger.

As used herein, the term "circuit" refers to an arrangement of electronic components (e.g., transistors, resistors, capacitors, and/or inductors) that is structured to implement one or more functions. For example, a circuit may include one or more transistors interconnected to form logic gates that collectively implement a logical function.

Details

Low-swing input voltages can present challenges for Schmitt trigger circuits. For example, if an input to a Schmitt Trigger has a very low swing (e.g., +/−50 mV from the threshold), which is just crossing the threshold on a respective transition, at very worst or skew corners it may not switch as expected because the transistor may not receive adequate time or voltage level to switch. Some implementations may sense the input change and help to build the potential so that a transistor will be able to switch to the corresponding threshold even if the input voltage at the gate remains small after crossing the threshold.

For example, a low-swing Schmitt trigger circuit may sense the input change as early as possible and provide an additional path for building or helping the Schmitt trigger to change the state even though the input swing remains low or just crossed the threshold.

Figure 2:
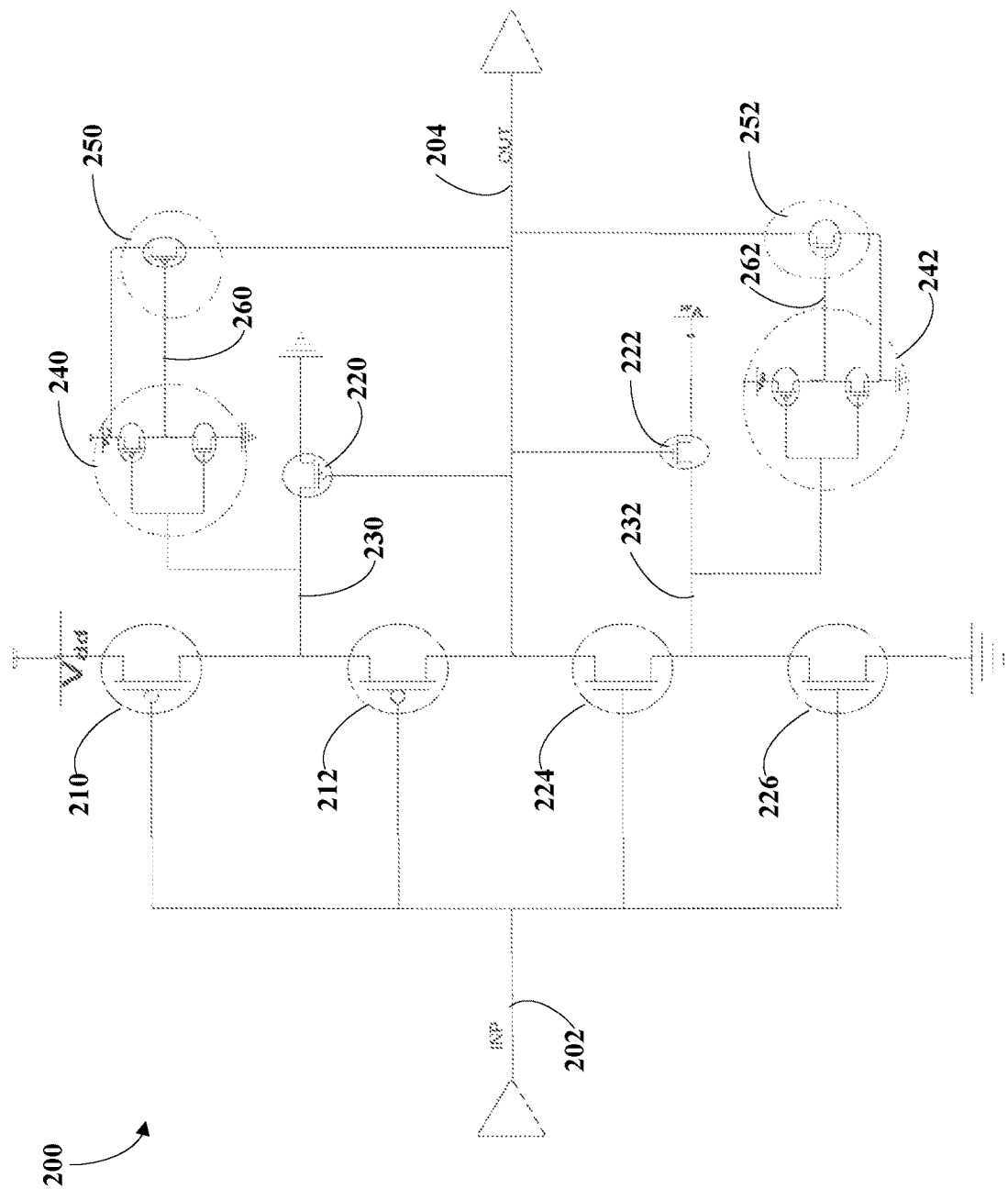
FIG. 2 is a circuit diagram of an example of a low-swing CMOS Schmitt trigger.

FIG. 2 is a circuit diagram of an example of a low-swing CMOS Schmitt trigger circuit 200. A Schmitt Trigger is a logic circuit, unlike an inverter, the output state will switch in response to crossings of different thresholds (V_l, V_h) for high-to-low transitions and low-to-high transitions. For example, when the input voltage switches to a logic zero state, the upper PMOS transistor begins to start conducting and thereby a first feedback node 230 gets charged and starts building potential. However, as per the problem stated, if the input voltage is not a proper logic zero or just 50 mV crossed below threshold, the potential build-up to change the state may not be enough, so as soon as the input state changes the inverter starts conducting and helps to switch the state. The low-swing Schmitt trigger circuit 200 includes an inverter and a coupled transistor providing an additional path on both the sides for both logical states (0 or 1). The transistors of the threshold voltage sensor 240 and the current source 250 control and provide the additional path for Logic 1. The transistors of the threshold voltage sensor 242 and the current sink 252 control and provide the additional path for Logic 0. The amount of hysteresis can be selected by properly sizing the PMOS and NMOS transistors respectively.

The techniques and architectures described herein can be used in very high-speed designs. In high speed circuits the voltage swing may be less and just cross the thresholds of the device, so the low-swing designs may provide better noise rejection.

FIG. 1 is a block diagram of an example of a low-swing Schmitt trigger 100. The low-swing Schmitt trigger 100 includes a Schmitt trigger 102 with an input node 104 and an output node 106. The Schmitt trigger 102 includes a comparator 110, an attenuator 112, and a summer 114. The attenuator 112 takes an output voltage from the comparator 110 at the output node 106 as input and outputs an attenuated voltage level at the node 124. The summer 114 is configured to receive an input voltage at the input node 104 and an attenuated voltage level of the output node 106 from the node 124 as inputs. The summer 114 is configured to output a feedback voltage at the feedback node 126, which is input to comparator 110. The low-swing Schmitt trigger 100 includes a voltage sensor 140 connected to the feedback node 126 and configured to cause a current source or current sink 150 to pull up or pull down an output voltage level at the output node 106 responsive to the feedback voltage level crossing a threshold. For example, the low-swing Schmitt trigger 100 may be used to implement the process 400 of FIG. 4. For example, the low-swing Schmitt trigger 100 may be used to implement the process 500 of FIG. 5.

The low-swing Schmitt trigger 100 may be implemented with a variety of circuit topologies. In some implementations, the low-swing Schmitt trigger 100 uses series feedback (e.g., including an emitter-coupled Schmitt trigger or an op-amp inverting Schmitt trigger). In some implementations, the low-swing Schmitt trigger 100 uses parallel feedback (e.g., including a collector-base coupled Schmitt trigger or an op-amp non-inverting Schmitt trigger). For example, the Schmitt trigger 102 may be a non-inverting Schmitt trigger. For example, the Schmitt trigger 102 may be a CMOS inverting Schmitt trigger. For example, the low-swing Schmitt trigger 100 may be implemented as the low-swing CMOS Schmitt trigger 200 of FIG. 2.

The low-swing Schmitt trigger 100 includes a Schmitt trigger 102 including an input node 104, an output node 106, and a feedback node 126 that is configured to bear a feedback voltage level that is a sum of an input voltage level at the input node 104 and an attenuated voltage level of the output node 106. By inputting the voltage at the feedback node 126 to the comparator 110, rather than the input voltage at the input node 104, the Schmitt trigger 102 implements hysteresis in its transfer function. In some implementations, the Schmitt trigger 102 includes multiple feedback nodes 126 (e.g., the first feedback node 230 and the second feedback node 232 of FIG. 2) that are used to implement hysteresis of the Schmitt trigger 102 in different states.

The low-swing Schmitt trigger 100 includes a current source or a current sink 150 connected to the output node 106. For example, a current source 150 may be configured to turn on and pull up an output voltage at the output node 106 responsive to a control signal from the voltage sensor 140 on the control node 145. In some implementations, the current source 150 includes a parallel pull-up transistor (e.g., the parallel pull-up transistor of the current source 250). For example, a current sink 150 may be configured to turn on and pull down an output voltage at the output node 106 responsive to a control signal from the voltage sensor 140 on the control node 145. In some implementations, the current sink 150 includes a parallel pull-down transistor (e.g., the parallel pull-down transistor of the current sink 252). In some implementations, the low-swing Schmitt trigger 100 includes a current source and current sink (e.g., including the parallel pull-up transistor of the current source 250 and the pull-down transistor of the current sink 252 of FIG. 2) that are both connected to the output node 106.

The low-swing Schmitt trigger 100 includes a voltage sensor 140 connected to the feedback node 126 and configured to cause the current source 150 to pull up an output voltage level at the output node 106 responsive to the feedback voltage level crossing a threshold. The voltage sensor 140 may use various circuit topologies. For example, the voltage sensor 140 may include a CMOS threshold voltage sensor. In some implementations, low-swing Schmitt trigger 100 includes the multiple voltage sensors 140 (e.g., the first voltage sensor 240 and the second voltage sensor 242 of FIG. 2) connected to respective feedback nodes 126. For example, the feedback nodes 126 may be a first feedback node, the feedback voltage may be a first feedback voltage, the voltage sensor 140 may be first voltage sensor, the threshold may be a first threshold, and the Schmitt trigger 102 may include a second feedback node that is configured to bear a second feedback voltage level that is a sum of the input voltage level and an attenuated voltage level of the output node 106. The low-swing Schmitt trigger 100 may also include a current sink 150 connected to the output node 106, and a second voltage sensor connected to the second feedback node and configured to cause the current sink 150 to pull down the output voltage level at the output node 106 responsive to the second feedback voltage level crossing a second threshold.

FIG. 2 is a circuit diagram of an example of a low-swing CMOS Schmitt trigger 200. The low-swing CMOS Schmitt trigger 200 includes an input node 202; an output node 204; a PMOS transistor 210 with a gate terminal connected to the input node 202; a PMOS transistor 212 with a gate terminal connected to the input node 202 and a drain terminal connected to the output node 204; a first feedback transistor 220 with a gate terminal connected to the output node 204; a second feedback transistor 222 with a gate terminal connected to the output node 204; an NMOS transistor 224 with a gate terminal connected to the input node 202 and a drain terminal connected to the output node 204; an NMOS transistor 226 with a gate terminal connected to the input node 202; a first feedback node 230 connecting a drain terminal of the PMOS transistor 210, a source terminal of the PMOS transistor 212, and a source terminal of the feedback transistor 220; a second feedback node 232 connecting a source terminal of the NMOS transistor 224, a drain terminal of the NMOS transistor 212, and a source terminal of the feedback transistor 222. The low-swing CMOS Schmitt trigger 200 includes a first voltage sensor 240 with an input terminal connected to the first feedback node 230; a second voltage sensor 242 with an input terminal connected to the second feedback node 232; a current source 250 with an output terminal connected to the output node 204; a current sink 252 with an output terminal connected to the output node 204; a first control node 260 connecting the first voltage sensor 240 and the current source 250; and a second control node 262 connecting the second voltage sensor 242 and the current sink 252. For example, the low-swing CMOS Schmitt trigger 200 may be used to implement the process 400 of FIG. 4. For example, the low-swing CMOS Schmitt trigger 200 may be used to implement the process 500 of FIG. 5.

The low-swing CMOS Schmitt trigger 200 includes a Schmitt trigger including the input node 202, the output node 204, and the first feedback transistor 220 with a gate terminal connected to the output node 204. The Schmitt trigger includes the second feedback transistor 222 with a gate terminal connected to the output node 204. In this example, the first feedback transistor 220 is a PMOS transistor and the second feedback transistor 222 is an NMOS transistor.

The low-swing CMOS Schmitt trigger 200 includes a current source 250 connected to the output node 204. In some implementations, the current source includes a parallel pull-up transistor. For example, the current source 250 may include a PMOS transistor with a gate connected (e.g., connected via the first control node 260) to an output of the first voltage sensor 240. A drain terminal of this PMOS transistor may be connected to the output node 204. A source terminal of this PMOS transistor may be connected to a power source. For example, the current source 250 may be activated to provide an additional current path to the output node 204, which may hasten a transition of an output voltage level at the output node 204 to a high or logic 1 state.

The low-swing CMOS Schmitt trigger 200 includes a current sink 252 connected to the output node 204. In some implementations, the current sink 252 includes a parallel pull-down transistor. For example, the current sink 252 may include an NMOS transistor with a gate connected to an output of the second voltage sensor 242. A drain terminal of this NMOS transistor may be connected to the output node 204. A source terminal of this NMOS transistor may be connected to a ground terminal. For example, the current sink 252 may be activated to provide an additional current path from the output node 204, which may hasten a transition of an output voltage level at the output node 204 to a low or logic 0 state.

The low-swing CMOS Schmitt trigger 200 includes a first voltage sensor 240 connected to a source terminal of the first feedback transistor 220 and configured to cause the current source 250 to pull up an output voltage level at the output node 204 responsive to a voltage level at the source terminal of the first feedback transistor 220 crossing a first threshold. For example, the first voltage sensor 240 may include a CMOS threshold voltage sensor.

The low-swing CMOS Schmitt trigger 200 includes a second voltage sensor 242 connected to a source terminal of the second feedback transistor 222 and configured to cause the current sink 252 to pull down the output voltage level at the output node 204 responsive to a voltage level at the source terminal of the second feedback transistor 222 crossing a second threshold. For example, the second voltage sensor 242 may include a CMOS threshold voltage sensor.

Figure 3:
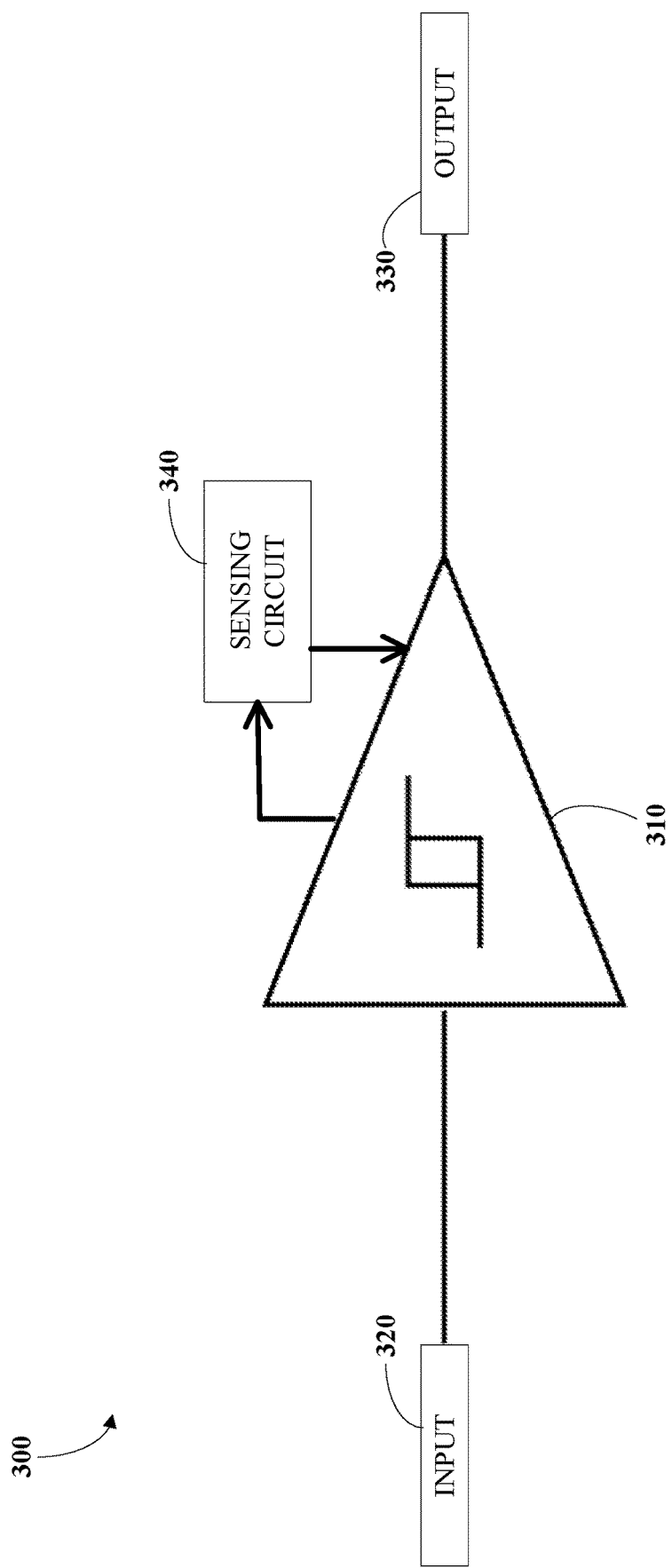
FIG. 3 is a block diagram of an example of a low-swing Schmitt trigger.

FIG. 3 is a block diagram of an example of a low-swing Schmitt trigger 300. The low-swing Schmitt trigger 300 includes a Schmitt trigger 310 with an input node 320 and an output node 330. The Schmitt trigger 310 has a first threshold voltage that triggers transitions of the output to a high or logic 1 state, and a second threshold voltage that triggers transitions of the output to a low or logic 0 state. The low-swing Schmitt trigger 300 includes a sensing circuit 340 configured to detect when an internal feedback signal of the Schmitt trigger 310 crosses a threshold, and responsive to crossing of the threshold, generate a control signal to open an alternate current path to the output node 330 to enable fast state transition of an output voltage at the output node 330 even in the presence of a low-swing voltage at the input node 320.

Figure 4:
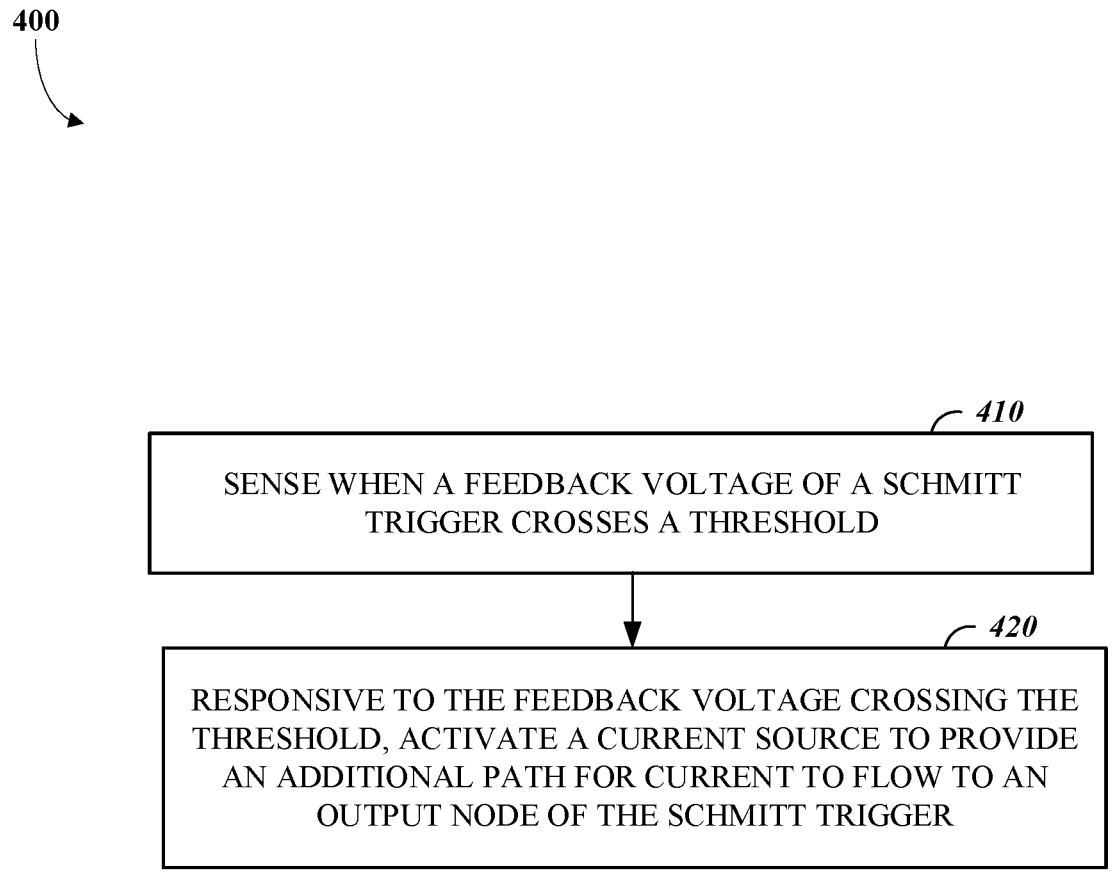
FIG. 4 is a flow chart of an example of a process for amplifying an input signal with low-swing while rejecting noise on the input signal.

FIG. 4 is a flow chart of an example of a process 400 for amplifying an input signal with low-swing while rejecting noise on the input signal. The process 400 includes sensing 410 when a feedback voltage of a Schmitt trigger crosses a threshold; and, responsive to the feedback voltage of the Schmitt trigger crossing the threshold, activating a current source to provide an additional path for current to flow to an output node of the Schmitt trigger. For example, the process 400 may be implemented using the low-swing Schmitt trigger 100 of FIG. 1. For example, the process 400 may be implemented using the low-swing CMOS Schmitt trigger 200 of FIG. 2. For example, the process 400 may be implemented using the low-swing Schmitt trigger 300 of FIG. 3.

The process 400 includes sensing 410 when a feedback voltage (e.g., at the feedback node 126 or at the first feedback node 230) of a Schmitt trigger crosses a threshold. The feedback voltage may be a sum of an input voltage level at an input node of the Schmitt trigger and an attenuated voltage level of an output node of the Schmitt trigger. For example, the threshold may correspond to a low-to-high switching threshold of the Schmitt trigger. In some implementations, the Schmitt trigger is a CMOS inverting Schmitt trigger. In some implementations, the Schmitt trigger is a non-inverting Schmitt trigger.

The process 400 includes, responsive to the feedback voltage crossing the threshold, activating 420 a current source (e.g., the current source 250) to provide an additional path for current to flow to an output node of the Schmitt trigger. For example, the current source may include a parallel pull-up transistor. For example, the current source may include a MOS transistor, and activating 420 the current source may include changing a voltage at a gate terminal of the MOS transistor.

Figure 5:
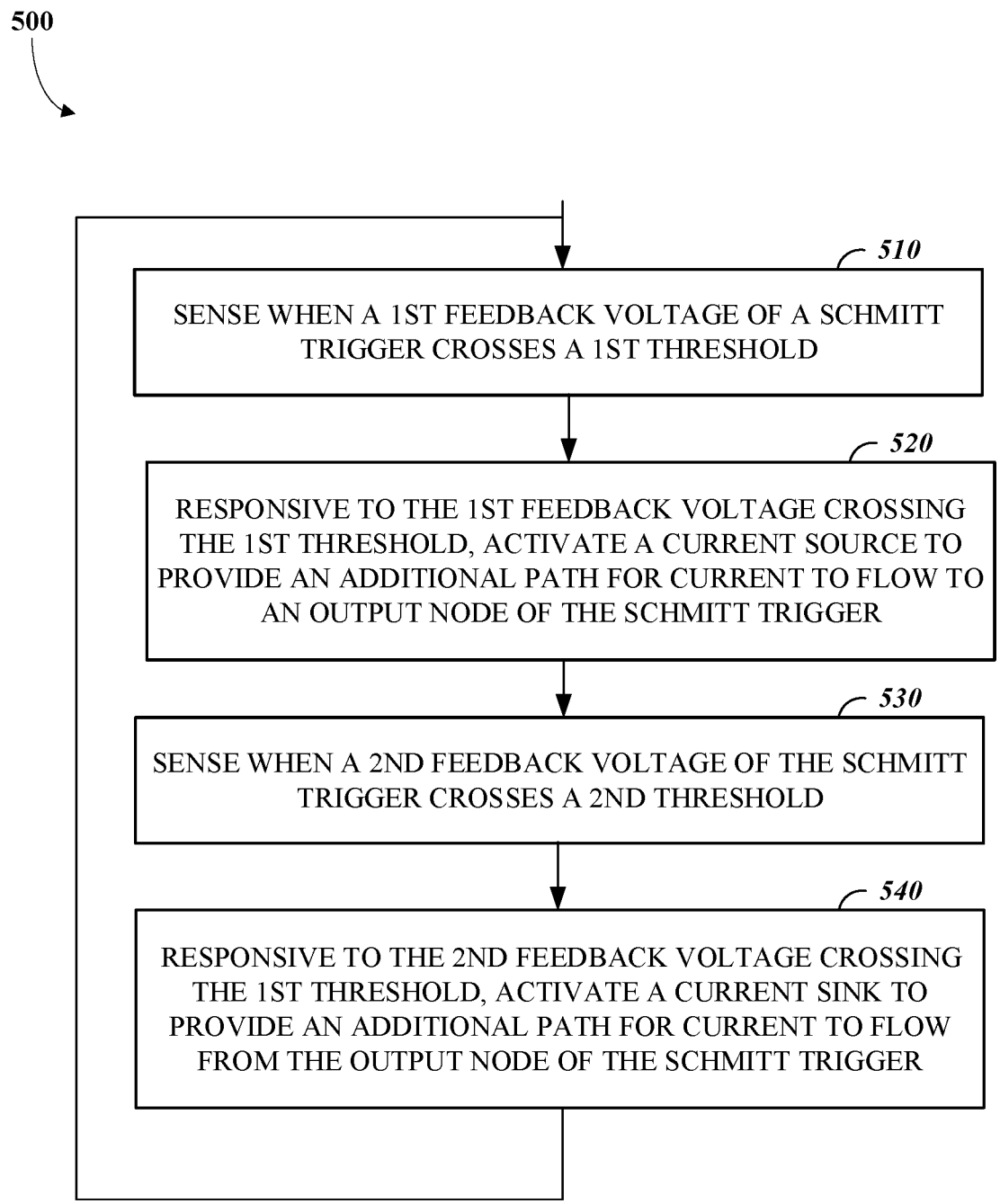
FIG. 5 is a flow chart of an example of a process for amplifying an input signal with low-swing while rejecting noise on the input signal.

FIG. 5 is a flow chart of an example of a process 500 for amplifying an input signal with low-swing while rejecting noise on the input signal. The process 500 includes sensing 510 when a first feedback voltage of a Schmitt trigger crosses a first threshold; responsive to the feedback voltage crossing the threshold, activating 520 a current source to provide an additional path for current to flow to an output node of the Schmitt trigger; sensing 530 when a second feedback voltage of a Schmitt trigger crosses a second threshold; and, responsive to the second feedback voltage crossing the second threshold, activating 540 a current sink to provide an additional path for current to flow from the output node of the Schmitt trigger. For example, the process 500 may be implemented using the low-swing Schmitt trigger 100 of FIG. 1. For example, the process 500 may be implemented using the low-swing CMOS Schmitt trigger 200 of FIG. 2. For example, the process 500 may be implemented using the low-swing Schmitt trigger 300 of FIG. 3.

The process 500 includes sensing 510 when a first feedback voltage (e.g., at the first feedback node 230) of a Schmitt trigger crosses a first threshold. The first feedback voltage may be a sum of an input voltage level at an input node of the Schmitt trigger and an attenuated voltage level of an output node of the Schmitt trigger. For example, the first threshold may correspond to a low-to-high switching threshold of the Schmitt trigger. In some implementations, the Schmitt trigger is a CMOS inverting Schmitt trigger. In some implementations, the Schmitt trigger is a non-inverting Schmitt trigger.

The process 500 includes, responsive to the first feedback voltage crossing the first threshold, activating 520 a current source (e.g., the current source 250) to provide an additional path for current to flow to an output node of the Schmitt trigger. For example, the current source may include a parallel pull-up transistor. For example, the current source may include a MOS transistor, and activating 520 the current source may include changing a voltage at a gate terminal of the MOS transistor.

The process 500 includes sensing 530 when a second feedback voltage (e.g., at the second feedback node 232) of a Schmitt trigger crosses a second threshold. The second feedback voltage may be a sum of the input voltage level at the input node of the Schmitt trigger and an attenuated voltage level of the output node of the Schmitt trigger. For example, the second threshold may correspond to a high-to-low switching threshold of the Schmitt trigger.

The process 500 includes, responsive to the second feedback voltage crossing the second threshold, activating 540 a current sink (e.g., the current sink 252) to provide an additional path for current to flow from the output node of the Schmitt trigger. For example, the current sink may include a parallel pull-down transistor. For example, the current sink may include a MOS transistor, and activating 540 the current source may include changing a voltage at a gate terminal of the MOS transistor.

The process 500 may be repeated in response to changes in an input voltage at the input node of the Schmitt trigger to receive a low-swing input signal at the input node. For example, the process 500 may be used to received data over a high-speed serial bus.

In a first aspect, the subject matter described in this specification can be embodied in an apparatus that includes a Schmitt trigger including an input node, an output node, and a feedback node that is configured to bear a feedback voltage level that is a sum of an input voltage level at the input node and an attenuated voltage level of the output node; a current source connected to the output node; and a voltage sensor connected to the feedback node and configured to cause the current source to pull up an output voltage level at the output node responsive to the feedback voltage level crossing a threshold. For example, the feedback node may be a first feedback node, the feedback voltage may be a first feedback voltage, the voltage sensor may be a first voltage sensor, the threshold may be a first threshold, and the Schmitt trigger may include a second feedback node that is configured to bear a second feedback voltage level that is a sum of the input voltage level and an attenuated voltage level of the output node. In the first aspect, the apparatus may include a current sink connected to the output node; and a second voltage sensor connected to the second feedback node and configured to cause the current sink to pull down the output voltage level at the output node responsive to the second feedback voltage level crossing a second threshold. In the first aspect, the current source may include a PMOS transistor with a gate connected to an output of the voltage sensor. In the first aspect, the current source may include a parallel pull-up transistor. In the first aspect, the first voltage sensor may include a CMOS threshold voltage sensor. In the first aspect, the current sink may include an NMOS transistor with a gate connected to an output of the second voltage sensor. In the first aspect, the current sink may include a parallel pull-down transistor. In the first aspect, the second voltage sensor may include a CMOS threshold voltage sensor. For example, the Schmitt trigger may be a CMOS inverting Schmitt trigger. For example, the Schmitt trigger may be a non-inverting Schmitt trigger.

In a second aspect, the subject matter described in this specification can be embodied in methods that include sensing when a feedback voltage of a Schmitt trigger crosses a threshold, wherein the feedback voltage is a sum of an input voltage level at an input node of the Schmitt trigger and an attenuated voltage level of an output node of the Schmitt trigger; and, responsive to the feedback voltage crossing the threshold, activating a current source to provide an additional path for current to flow to an output node of the Schmitt trigger. For example, the feedback voltage may be a first feedback voltage and the threshold may be a first threshold. In the second aspect, the method may include sensing when a second feedback voltage of a Schmitt trigger crosses a second threshold, wherein the second feedback voltage is a sum of the input voltage level at the input node of the Schmitt trigger and an attenuated voltage level of the output node of the Schmitt trigger; and, responsive to the second feedback voltage crossing the threshold, activating a current sink to provide an additional path for current to flow from the output node of the Schmitt trigger. In the second aspect, the current source may include a parallel pull-up transistor. In the second aspect, the current sink may include a parallel pull-down transistor. For example, the Schmitt trigger may be a CMOS inverting Schmitt trigger. For example, the Schmitt trigger may be a non-inverting Schmitt trigger.

In a third aspect, the subject matter described in this specification can be embodied in an apparatus that includes a Schmitt trigger including an input node, an output node, and a feedback transistor with a gate terminal connected to the output node; a current source connected to the output node; and a voltage sensor connected to a source terminal of the feedback transistor and configured to cause the current source to pull up an output voltage level at the output node responsive to a voltage level at the source terminal of the feedback transistor crossing a threshold. For example, the feedback transistor may be a first feedback transistor, the voltage sensor may be a first voltage sensor, the threshold may be a first threshold, and the Schmitt trigger may include a second feedback transistor with a gate terminal connected to the output node. In the third aspect, the apparatus may include a current sink connected to the output node; and a second voltage sensor connected to a source terminal of the second feedback transistor and configured to cause the current sink to pull down the output voltage level at the output node responsive to a voltage level at the source terminal of the second feedback transistor crossing a second threshold. In the third aspect, the first feedback transistor may be a PMOS transistor and the second feedback transistor may be an NMOS transistor. In the third aspect, the current source may include a PMOS transistor with a gate connected to an output of the voltage sensor. In the third aspect, the current source may include a parallel pull-up transistor. In the third aspect, the first voltage sensor may include a CMOS threshold voltage sensor. In the third aspect, the current sink may include an NMOS transistor with a gate connected to an output of the second voltage sensor. In the third aspect, the current sink may include a parallel pull-down transistor. In the third aspect, the second voltage sensor may include a CMOS threshold voltage sensor.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. An apparatus comprising:
   a Schmitt trigger including an input node, an output node, and a feedback transistor with a gate terminal directly connected to the output node;
   a current source directly connected to the output node; and
   a voltage sensor directly connected to a source terminal of the feedback transistor and configured to cause the current source to pull up an output voltage level at the output node responsive to a voltage level at the source terminal of the feedback transistor crossing a threshold.

2. The apparatus of claim 1, wherein the feedback transistor is a first feedback transistor, the voltage sensor is a first voltage sensor, the threshold is a first threshold, and the Schmitt trigger includes a second feedback transistor with a gate terminal directly connected to the output node, comprising:
   a current sink directly connected to the output node; and
   a second voltage sensor directly connected to a source terminal of the second feedback transistor and configured to cause the current sink to pull down the output voltage level at the output node responsive to a voltage level at the source terminal of the second feedback transistor crossing a second threshold.

3. The apparatus of claim 2, in which the first feedback transistor is a PMOS transistor and the second feedback transistor is an NMOS transistor.

4. The apparatus of claim 2, in which the current source includes a PMOS transistor with a gate directly connected to an output of the voltage sensor.

5. The apparatus of claim 2, in which the current source includes a parallel pull-up transistor.

6. The apparatus of claim 2, in which the first voltage sensor includes a CMOS threshold voltage sensor.

7. The apparatus of claim 2, in which the current sink includes an NMOS transistor with a gate directly connected to an output of the second voltage sensor.

8. The apparatus of claim 2, in which the current sink includes a parallel pull-down transistor.

9. The apparatus of claim 2, in which the second voltage sensor includes a CMOS threshold voltage sensor.

* * * * *